(12) United States Patent
Sengupta

(10) Patent No.: US 9,716,193 B2
(45) Date of Patent: Jul. 25, 2017

(54) INTEGRATED OPTICAL SENSOR MODULE

(75) Inventor: Dipak Sengupta, Boxborough, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 68 days.

(21) Appl. No.: 13/462,604

(22) Filed: May 2, 2012

(65) Prior Publication Data

US 2013/0292786 A1  Nov. 7, 2013

(51) Int. Cl.
| | |
|---|---|
| *H01L 25/04* | (2014.01) |
| *H01L 25/16* | (2006.01) |
| *H01L 31/12* | (2006.01) |
| *H01L 31/02* | (2006.01) |
| *G02B 6/42* | (2006.01) |
| *H01L 31/0232* | (2014.01) |
| *H01L 31/0203* | (2014.01) |

(52) U.S. Cl.
CPC ........ *H01L 31/02325* (2013.01); *G02B 6/423* (2013.01); *H01L 31/0203* (2013.01); *G02B 6/4201* (2013.01); *G02B 6/4228* (2013.01); *H01L 25/041* (2013.01); *H01L 25/167* (2013.01); *H01L 31/02002* (2013.01); *H01L 31/02016* (2013.01); *H01L 31/12* (2013.01)

(58) Field of Classification Search
CPC ..... H01L 25/041; H01L 25/167; H01L 31/12; H01L 31/02002; H01L 31/02016; G02B 6/4201; G02B 6/4228
USPC .......................................................... 257/434
See application file for complete search history.

(56) References Cited

U.S. PATENT DOCUMENTS

| | | |
|---|---|---|
| 5,247,597 A | 9/1993 | Blacha et al. |
| 5,340,420 A | 8/1994 | Ozimek et al. |
| 5,421,928 A | 6/1995 | Knecht et al. |
| 5,500,505 A | 3/1996 | Jones |
| 5,643,472 A | 7/1997 | Engelsberg et al. |
| 6,113,835 A | 9/2000 | Kato et al. |

(Continued)

FOREIGN PATENT DOCUMENTS

| | | |
|---|---|---|
| DE | 19909242 A1 | 8/2000 |
| EP | 1 276 142 A2 | 1/2003 |

(Continued)

OTHER PUBLICATIONS

U.S. Appl. No. 12/784,184, filed May 22, 2011, and published as 2011/0286690 on Nov. 24, 2011, and its ongoing prosecution history including without limitation, Office Action, Amendments, Remarks, and any other potentially relevant documents, Nov. 24, 2011, Deliwala et al.

(Continued)

*Primary Examiner* — David Zarneke
(74) *Attorney, Agent, or Firm* — Knobbe, Martens, Olson & Bear LLP

(57) ABSTRACT

An integrated optical sensor module includes an optical sensor die having an optical sensing area on its first surface, and an application-specific integrated circuit (ASIC) die arranged over the first surface of the optical sensor die. A hole in the ASIC die is at least partially aligned with the optical sensing area such that at least some of the light passing through the hole may contact the optical sensing area. The hole through the ASIC die can be configured to receive an optical fiber, lens structure, or other optical element therein.

47 Claims, 5 Drawing Sheets

(56) References Cited

U.S. PATENT DOCUMENTS

| | | | |
|---|---|---|---|
| 6,335,224 B1 | 1/2002 | Peterson et al. | |
| 6,352,880 B1 | 3/2002 | Takai et al. | |
| 6,379,988 B1 | 4/2002 | Peterson et al. | |
| 6,396,116 B1 * | 5/2002 | Kelly et al. | 257/432 |
| 6,489,686 B2 | 12/2002 | Farooq et al. | |
| 6,531,328 B1 | 3/2003 | Chen | |
| 6,576,867 B1 | 6/2003 | Lu et al. | |
| 6,602,430 B1 | 8/2003 | Nally et al. | |
| 6,707,161 B2 * | 3/2004 | Moon et al. | 257/778 |
| 6,787,916 B2 | 9/2004 | Halahan | |
| 6,825,065 B2 * | 11/2004 | Moon et al. | 438/108 |
| 6,864,460 B2 | 3/2005 | Cummings et al. | |
| 6,869,231 B2 | 3/2005 | Chiu et al. | |
| 6,878,564 B2 | 4/2005 | Silverbrook | |
| 6,878,900 B2 | 4/2005 | Corkum et al. | |
| 6,915,049 B2 | 7/2005 | Murata | |
| 6,930,398 B1 | 8/2005 | Sun et al. | |
| 7,049,639 B2 | 5/2006 | Wang et al. | |
| 7,209,362 B2 | 4/2007 | Bando | |
| 7,279,343 B1 | 10/2007 | Weaver et al. | |
| 7,294,827 B2 * | 11/2007 | Tan et al. | 250/239 |
| 7,405,487 B2 | 7/2008 | Brand | |
| 7,442,559 B2 | 10/2008 | Auburger et al. | |
| 7,485,848 B2 * | 2/2009 | Minamio | 250/239 |
| 7,720,337 B2 * | 5/2010 | Lu et al. | 385/52 |
| 7,723,146 B2 * | 5/2010 | Chow et al. | 438/64 |
| 7,755,030 B2 * | 7/2010 | Minamio | 250/239 |
| 7,807,505 B2 | 10/2010 | Farnworth et al. | |
| 7,838,899 B2 * | 11/2010 | Chow et al. | 257/100 |
| 7,858,437 B2 | 12/2010 | Jung et al. | |
| 8,033,446 B2 * | 10/2011 | Wada et al. | 228/180.22 |
| 8,115,307 B2 | 2/2012 | Toyama et al. | |
| 8,378,502 B2 * | 2/2013 | Chow et al. | 257/778 |
| 8,399,994 B2 | 3/2013 | Roh et al. | |
| 8,601,677 B2 * | 12/2013 | Doany et al. | 29/740 |
| 2002/0021874 A1 | 2/2002 | Giboney et al. | |
| 2002/0181882 A1 | 12/2002 | Hibbs-Brenner et al. | |
| 2003/0197292 A1 | 10/2003 | Huang | |
| 2003/0219217 A1 | 11/2003 | Wickman et al. | |
| 2004/0037507 A1 | 2/2004 | Marion et al. | |
| 2005/0087522 A1 | 4/2005 | Sun et al. | |
| 2005/0135071 A1 | 6/2005 | Wang et al. | |
| 2005/0226569 A1 | 10/2005 | Sashinaka et al. | |
| 2006/0001116 A1 | 1/2006 | Auburger et al. | |
| 2006/0027479 A1 | 2/2006 | Auburger et al. | |
| 2006/0045421 A1 | 3/2006 | Baets et al. | |
| 2006/0049548 A1 | 3/2006 | Auburger et al. | |
| 2006/0126331 A1 | 6/2006 | Chien | |
| 2007/0222041 A1 | 9/2007 | Weng et al. | |
| 2008/0079019 A1 | 4/2008 | Huang et al. | |
| 2008/0157252 A1 | 7/2008 | Cheng et al. | |
| 2009/0011522 A1 | 1/2009 | Drennan et al. | |
| 2009/0014857 A1 | 1/2009 | Hufgard | |
| 2009/0046144 A1 | 2/2009 | Tuttle | |
| 2009/0070727 A1 | 3/2009 | Solomon | |
| 2009/0134481 A1 | 5/2009 | Sengupta | |
| 2009/0189177 A1 | 7/2009 | Lee et al. | |
| 2009/0213262 A1 | 8/2009 | Singh et al. | |
| 2009/0218588 A1 | 9/2009 | Panaccione et al. | |
| 2009/0226130 A1 * | 9/2009 | Doany et al. | 385/14 |
| 2009/0269006 A1 | 10/2009 | Ishikawa et al. | |
| 2010/0019393 A1 | 1/2010 | Hsieh et al. | |
| 2010/0187557 A1 | 7/2010 | Samoilov et al. | |
| 2010/0200998 A1 | 8/2010 | Furuta et al. | |
| 2010/0244217 A1 | 9/2010 | Ha et al. | |
| 2011/0024899 A1 | 2/2011 | Masumoto et al. | |
| 2011/0062572 A1 | 3/2011 | Steijer et al. | |
| 2011/0176765 A1 | 7/2011 | Lee | |
| 2012/0027234 A1 | 2/2012 | Goida | |
| 2013/0032388 A1 | 2/2013 | Lin et al. | |
| 2013/0285185 A1 * | 10/2013 | Park et al. | 257/434 |

FOREIGN PATENT DOCUMENTS

| | | |
|---|---|---|
| WO | WO 01/68460 A2 | 9/2001 |
| WO | WO 2007/005636 A2 | 1/2007 |

OTHER PUBLICATIONS

U.S. Appl. No. 13/411,375, filed Mar. 2, 2012, and its ongoing prosecution history including without limitation, Office Action, Amendments, Remarks, and any other potentially relevant documents, Doscher et al.

U.S. Appl. No. 13/560,855, filed Jul. 27, 2012, and its ongoing prosecution history including without limitation, Office Action, Amendments, Remarks, and any other potentially relevant documents, Goida.

Office Action mailed Jun. 17, 2014 in U.S. Appl. No. 13/560,855, filed Jul. 27, 2012 in 11 pages.

* cited by examiner

INTEGRATED OPTICAL SENSOR MODULE

BACKGROUND OF THE INVENTION

Field of the Invention

Embodiments of the invention relate to optical sensors and the integration of optical sensors with application-specific integrated circuit (ASIC) dies for the purpose of high-performance signal processing and package size reduction.

Background

Optical sensors can be used for a variety of applications including, for example, ambient light sensors, IR sensors, gesture, remote control, gaming, heartbeat monitors, blood oxygen monitors, fiber-optic data transfer, and digital cameras. Such applications can be used in diverse fields such as consumer electronics, healthcare, or telecommunications. Optical sensor modules can include an optical sensor die and an associated die, such as one or more amplifiers, analog-to-digital converters, microcontrollers etc. The associated die may be configured to process the output signal from the optical sensor die.

In many cases, the optical sensor die is separately packaged, and the packaged sensor is then provided in electrical communication with an adjacent ASIC. One reason for this is the sensor and ASIC may use different fabrication process technology. Some current packaging schemes for optical sensors include clear mold packages, cavity packages having clear lids or an open cutaway in a lid, or film-assisted mold (FAM) packaging in a quad-flat no-leads (QFN) or ball grid array (BGA) configuration. The sense and signal processing function integration is also possible in a single package using above technologies but are inefficient from size, cost and performance perspectives. Wafer-level chip-scale packaging (CSP) of image sensors have been developed. Packaging for both the sensor and the ASIC, whether together or separately, tends to occupy significant space. There is increasing emphasis on miniaturization of optical sensor assemblies across the electronics industry. Accordingly, there is a need for three-dimensional wafer-level integration of an optical sensor module with more compact packaging.

SUMMARY OF THE INVENTION

In one embodiment, an optical sensor device is provided. The device includes an optical sensor die having an optical sensing area on a first surface, an application-specific integrated circuit (ASIC) die arranged over the first surface of the optical sensor die, and a hole formed through the ASIC die, the hole being at least partially aligned with the optical sensing area.

In another embodiment, a method of manufacturing an optical sensor device is provided. The method includes providing an optical sensor die having an optical sensing area on a first surface, and disposing an ASIC die over the first surface of the optical sensor die. The ASIC die has a hole formed therethrough, and the hole is at least partially aligned with the optical sensing area.

In yet another embodiment, an optical sensor device is provided. The device includes an optical sensor die having an optical sensing area, and an ASIC die having a hole formed therethrough. The hole in the ASIC die is at least partially aligned with the optical sensing area.

BRIEF DESCRIPTION OF THE DRAWINGS

The invention and various embodiments and features may be better understood by reference to the following drawings in which.

DETAILED DESCRIPTION OF EMBODIMENTS

Figure 1A:
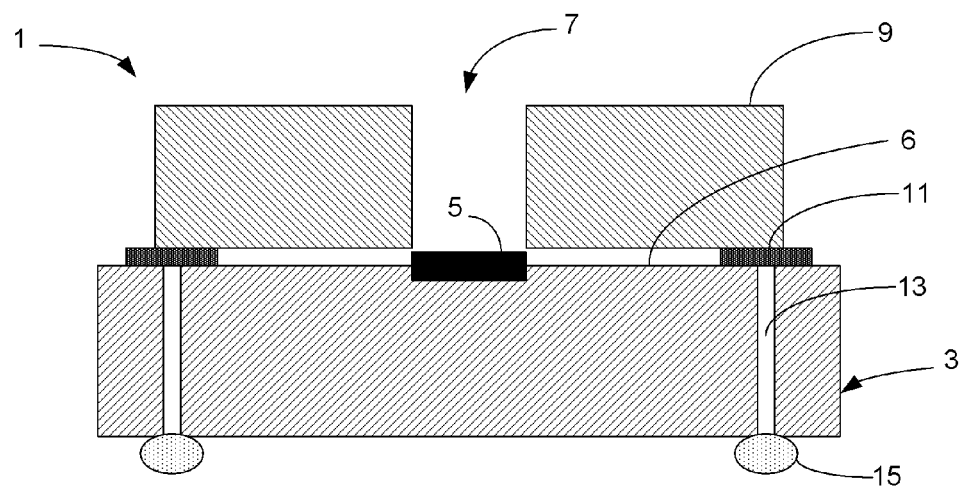
FIGS. 1A-1C are schematic cross-section views of an optical sensor module, according to various embodiments.

The following detail description of certain embodiments presents various descriptions of specific embodiments of the invention. However, the invention can be embodied in myriad different ways as defined and covered by the claims. In this description, reference is made to the drawings where like reference numerals indicate identical or functionally similar elements.

As used herein, directional terms such as "over," "under," "above," "below," "top," "bottom," etc. are intended to indicate relative positioning of the identified components. Such terms are not intended to reference absolute positioning. Accordingly, the entire system can be oriented in any direction, either during manufacturing or in use. The description and claims may refer to elements or features as being "mounted" or "attached" together. As used herein, unless expressly stated otherwise, "mounted" means that one element/feature is directly or indirectly connected to another element/feature. Likewise, unless expressly stated otherwise, "attached" means that one element/feature is directly or indirectly coupled to another element/feature, such as adhesive layers. Thus, although the various schematics shown in the figures depict example arrangements of elements and components, additional intervening elements, devices, features, or components may be present in an actual embodiment. Likewise, "adjacent" means that one element/feature is arranged next to another element/feature, but does not require direct connection or contact between the two.

FIG. 1A is a schematic cross-section view of one embodiment of an optical sensor module. The optical sensor module 1 includes an optical sensor die 3 with an optical sensing area 5 on a first surface 6. The optical sensing area 5 can vary in size. In some embodiments, the optical sensing area 5 can range from 50 to 300 microns in diameter. In other embodiments, the optical sensing area 5 can be much larger. The optical sensing area 5 can be substantially circular as seen in plan view, or can take a variety of other shapes. In some embodiments, the optical sensing area 5 can be substantially rectangular as seen in plan view. The optical sensor die 3 can be made of a semiconductor material, such as a diced portion of a silicon wafer. In some embodiments, the optical sensing area 5 is formed integrally within the optical sensor die 3. In other embodiments, the optical sensing area 5 may include a separately formed and mounted chip attached to the first surface 5. The first surface 6 of the optical sensor die 3, including the optical sensing area 5, can be passivated to protect against corrosion. For example, a polyimide layer or a silicon polyimide layer can be provided over the first surface 6 of the optical sensor die 3. In some embodiments, the polyimide layer can be applied at the wafer level, prior to singulation of a wafer into the plurality of individual optical sensor dies 3.

An ASIC die 9 is arranged vertically adjacent the optical sensor die 3. In the illustrated orientation, the ASIC die 9 is on top of the optical sensor die 3, arranged over the first surface 6. The ASIC die 9 can be made of a semiconductor material, such as silicon and can include various embedded passive electronic components (e.g., resistors, capacitors, inductors). In some embodiments, various passive electronic components can be attached to a separate packaging substrate and electrically interconnected to the ASIC die. In various embodiments, the ASIC die 9 can range in size from one millimeter across or larger. In some embodiments, the ASIC die 9 can be up to five millimeters across. The ASIC die 9 includes an integrated circuit formed therein. Typically, the integrated circuit is fabricated in a region near one surface of the ASIC die 9. The ASIC can be formed in the ASIC die 9 by use of standard semiconductor fabrication techniques known in the industry. The integrated circuit can be configured to serve any number of functions, depending on the specific application. For example, in various embodiments the ASIC die 9 can include an amplifier, an analog-to-digital converter, and/or a microcontroller.

Arranging the ASIC die 9 such that the surface on which the integrated circuit is fabricated faces the optical sensor die 3 can provide several benefits. In the illustrated configuration, the more sensitive side of the ASIC die is not exposed, and accordingly can be protected from environmental damage from particulate matter during use. Similarly, circuitry on the first surface 6 optical sensor die 3 that surrounds the optical sensing are 5 is protected, as it faces the ASIC die 9. This direct, die-to-die connection (flip chip orientation) between the optical sensor die 3 and the ASIC die 9 additionally provides robust electrical and mechanical connection without the need for bonding wires. This enables better sensor performance including low electrical losses and low noise. The die-to-die connection (flip chip orientation) can also reduce the overall footprint, as it involves stacking of the optical sensor die 3 and the ASIC die 9, one over the other. As a result of this stacked three-dimensional configuration, the circuitry of both the ASIC die 9 and the optical sensor die 3 can be protected from environmental damage, and the overall footprint of the optical sensor module 1 can be reduced.

As shown in FIG. 1A, a hole 7 is formed through the ASIC and is substantially aligned with the sensing area 5. In some embodiments, the hole can be substantially circular in cross-section. In some embodiments, the size of the widest cross-sectional width of the hole can range from about 10 microns to about 1 millimeter. In some embodiments, the widest cross-sectional width is between about 25 and 250 microns. Smaller and larger dimensions are possible, depending on the application. For example, a width of about 400-600 μm can be suitable for applications in which the hole accommodates other features, such as an optical fiber. As illustrated, the width of the hole 7 is approximately equal to the width of the optical sensing area 5. In other embodiments, however, the hole 7 can be substantially larger than the optical sensing are 5. Conversely, in some embodiments, the optical sensing area 5 can extend beyond the opening defined by the hole 7.

In the illustrated embodiment, the ASIC die 9 is vertically arranged facing downward, with the ASIC located within the ASIC die 9 nearest the side facing the optical sensor die 3. The optical sensor die 3 is arranged facing upward, meaning that the optical sensing area 5 on the first surface 6 of the optical sensor die 3 faces upward, as illustrated. As noted above, the orientations shown herein are relative, and the entire module 1 can be arranged in any configuration, either during manufacture or in use. With the hole 7 formed through the ASIC die 9, light can pass through the hole 7 and strike the optical sensing area 5. The thickness of the ASIC die 9 can also serve as a collimator, as light is more easily received by the optical sensing area 5 when aligned with the hole 7. In other words, the primary optical path for sensed light is through the hole 7 in the ASIC die 9.

The ASIC die 9 is attached to the optical sensor die 3 by adhesive 11. In use, the adhesive 11 can be arranged in an annular configuration substantially or completely surrounding the optical sensing are 5. The adhesive 11 can take several forms. For example, in some embodiments, the adhesive 11 is an anisotropic conducting film (ACF). In other embodiments, the adhesive 11 can be a nonconducting paste (NCP). In still other embodiments, the adhesive 11 can be solder. The adhesive 11 can be applied with a sufficient lateral width so as to be substantially opaque in the lateral dimension. The adhesive 11 therefore can provide a light-blocking ring around the optical sensing area 5, such that light is limited to reaching the optical sensing area 5 through the hole 7 in the ASIC die 9.

In some embodiments, the adhesive 11 can provide both mechanical and electrical interconnection between the optical sensor die 3 and the ASIC die 9. For example, both NCP and ACF can be arranged so as to conduct electricity only in the vertical direction. Accordingly, a solid annular ring around the optical sensing area 5 can still provide for multiple discrete electrical connections vertically between circuitry on the optical sensor die 3 and circuitry on the adjacent ASIC die 9. In other embodiments, for example in which the adhesive comprises solder, a solder ring (not shown) can be provided between annular metal pads around the hole on the bottom of the ASIC die and the upper surface of the sensor die to serve as a light blocking ring, and can optionally also serve as an electrical interconnection between the optical sensor die and the ASIC die. In that case, additional solder connections can be provided at other locations outside the light-blocking ring, such as the location shown for electrical connections 11 in FIG. 1A.

In the illustrated embodiment, vias 13 extend through the thickness of the optical sensor die 3. At the bottom of each vias 13 is a contact pad, shown with a solder bump 15 attached thereto. The skilled artisan will appreciate that the solder bumps can be provided during packaging or can be provided during board mounting on a larger external device. The vias 13 can include conductive material therein to allow for electrical interconnection between the ASIC die 9 and the contact pads. The contact pads (via the solder bumps 15 in the illustrated embodiment) can provide electrical and mechanical interconnection between the optical sensor module 1 and an external substrate or device as will be discussed in more detail below. Although solder bumps 15 are illustrated throughout, in other embodiments various other techniques can be used to provide for electrical and mechanical interconnection between the vias 13 and an external substrate or device, such as with NCP or ACF.

Figure 1B:
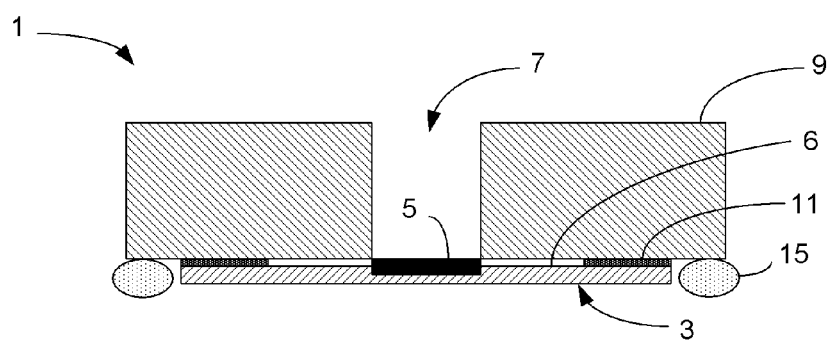

In the embodiment illustrated in FIG. 1B, the optical sensor die 3 is significantly thinner than in the embodiment illustrated in FIG. 1A. In this configuration, there is no need for the vias 13 shown in FIG. 1A. Rather, the solder bumps 15 can be arranged in direct contact with contact pads of the ASIC die 9, which is again face down, disposed over the first surface 6 of the optical sensor die 3. As described above, electrical interconnection is provided between the optical sensor die 3 and the ASIC die 9 through the adhesive 11, which can provide both mechanical and electrical connection between the two dies, and can also be arranged to block light. This can result in a stacked three-dimensional configuration having an overall lower profile.

Figure 1C:
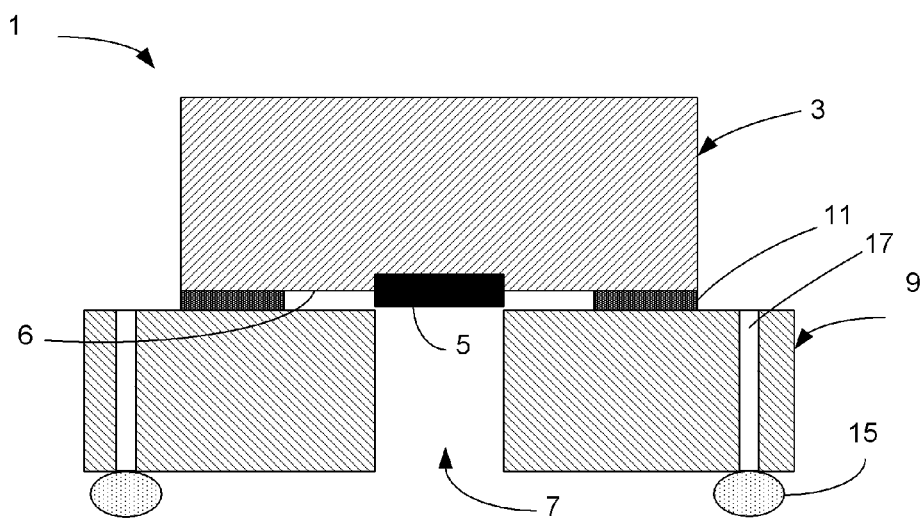

Another embodiment of an optical sensor module is shown in FIG. 1C. Here, the optical sensor die 3 is arranged with the optical sensing area 5 (and any other circuitry, including bond pads) facing downward. The ASIC die 9 is arranged face up beneath the optical sensor die 3, over the first surface 6. Adhesive 11 is provided both to block light from reaching the optical sensor area 5 from the sides, and to provide electrical and mechanical interconnection between the optical sensor die 3 and the ASIC die 9. In contrast to the embodiment illustrated in FIG. 1A, here there are through vias 17 formed through the ASIC die 9. The vias 17 provide for electrical interconnection between the circuitry near the top surface of the ASIC die 9 and contact pads (shown with solder bumps 15) arranged on the bottom surface of the ASIC die 9, aligned with the vias 17.

The embodiments illustrated in FIGS. 1A-1C are capable of providing a three-dimensionally stacked, extremely low profile integrated optical sensor module having an extremely small footprint. While in some embodiments the illustrated modules can be further surrounded by packaging materials, the modules can advantageously be employed without any additional lid or encapsulant to protect the sensitive components of the ASIC die 9 or the optical sensor die 3. Additionally, electrical connections allow for the integrated optical sensor modules to be directly board mounted. Accordingly, the illustrated module can be employed directly for board mounting without any separate packaging materials.

Figure 2A:
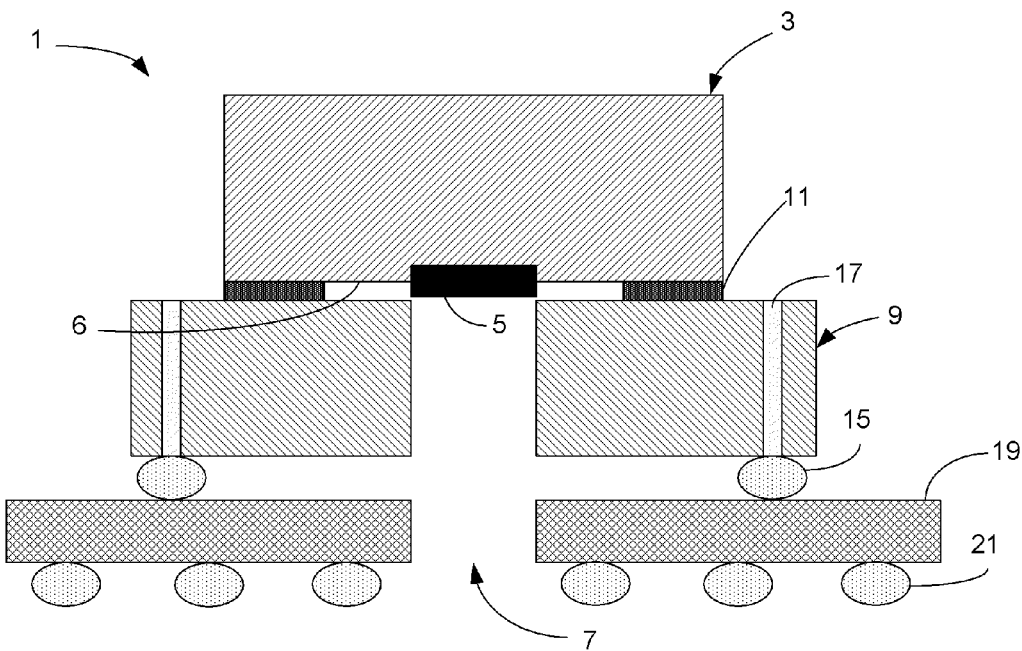
FIG. 2A is a schematic cross-section view of an optical sensor module mounted onto a rigid substrate.

FIG. 2A shows a schematic cross section of an optical sensor module mounted onto a rigid substrate. The optical sensor module 1 is configured similar to the embodiment of FIG. 1C. The optical sensor die 3 is facing downwards, such that the first surface 6 on which the optical sensing area 5 and attendant circuitry are disposed faces downward, as illustrated. The ASIC die 9 is arranged face-up beneath the optical sensor die 3, over the first side 6 of the optical sensor die 3. The ASIC die 9 includes a hole 7 substantially aligned with the optical sensing area 5. The optical sensor die 3 and ASIC die 9 are stacked and joined mechanically and electrically by the adhesive 11. As noted above, the adhesive 11 also serves to block light from reaching the optical sensing area 5 from the space between the first surface 6 optical sensor die 3 and the ASIC die 9. Accordingly, a "tunnel" or collimator is formed whereby light is permitted to enter through the hole 7 and to strike the optical sensing area 5. As illustrated, the optical sensor module 1 is mounted onto a substantially rigid substrate 19. The substantially rigid substrate 19 can be made of, for example, printed circuit board or ceramic, and can serve as a packaging substrate that forms part of the module 1, or can represent the board of a larger external device on which the module 1 is mounted. An opening is provided in the substantially rigid substrate such that the hole 7 extends through both the substrate 19 and the ASIC die 9. The solder bumps 15 are shown on the lower surface of the ASIC die 9 provide mechanical and electrical connection between the optical sensor module 1 and the substantially rigid substrate 19. A plurality of further solder bumps 21 are arranged beneath the substantially rigid substrate 19, allowing the entire assembly or "package" to be mounted to an additional substrate, and/or to be incorporated into a larger electronic device. As is known, solder bumps can be replaced with alternative means for electrical connection, such as NCP or ACF.

A similar approach can be applied to other embodiments of the optical sensor module disclosed herein. For example, the embodiment illustrated in FIG. 1A can be mounted onto a substantially rigid substrate. In such a configuration, there is no need to provide an additional opening in the substrate, as the hole in the ASIC die 9 is oriented to face in the opposite direction. Additionally, the embodiment illustrated in FIG. 1B can be mounted onto a substantially rigid substrate in a similar fashion.

Figure 2B:
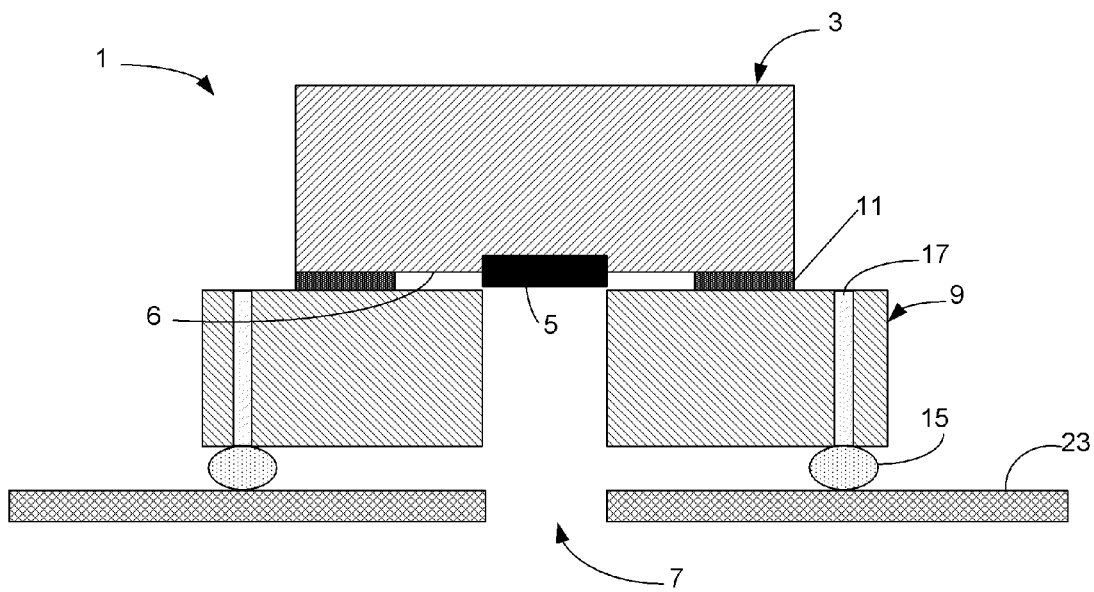
FIG. 2B is a schematic cross-section view of an optical sensor module mounted onto a flexible substrate.

FIG. 2B shows a schematic cross section of an optical sensor module mounted onto a flexible substrate. As with the embodiment shown in FIG. 2A, the optical sensor die 3 is vertically arranged on top of the ASIC die 9. The ASIC die 9 is disposed over the first surface 6 of the optical sensor die 3, such that the hole 7 allows light to pass therethrough and to strike the optical sensing area 5. As illustrated, the optical sensor module 1 is mounted onto a flexible substrate 23. The flexible substrate can be made of, for example, polyimide, PEEK (polyether ether ketone), transparent conductive polyester, or other suitable material, and can serve as a packaging substrate that forms part of the module 1. An opening is provided in the flexible substrate 23 such that the hole 7 extends through both the flexible substrate 23 and the ASIC die 9. Electrical and mechanical interconnection between the flexible substrate 23 and the optical sensor module 1 is provided through the solder bumps 15 or alternative means, such as NCP or ACF. The flexible substrate 23 can be connected externally through metal traces, interconnections to another board, ACF, NCP, connector modules, etc., as is known in the art.

A similar approach can be applied to other embodiments of the optical sensor module disclosed herein. For example, the embodiment illustrated in FIG. 1A can be mounted onto a flexible substrate. In such a configuration, there is no need to provide an additional opening in the substrate, as the hole in the ASIC die 9 is oriented to face in the opposite direction. Additionally, the embodiment illustrated in FIG. 1B can be mounted onto a flexible substrate in a similar fashion.

Figure 3A:
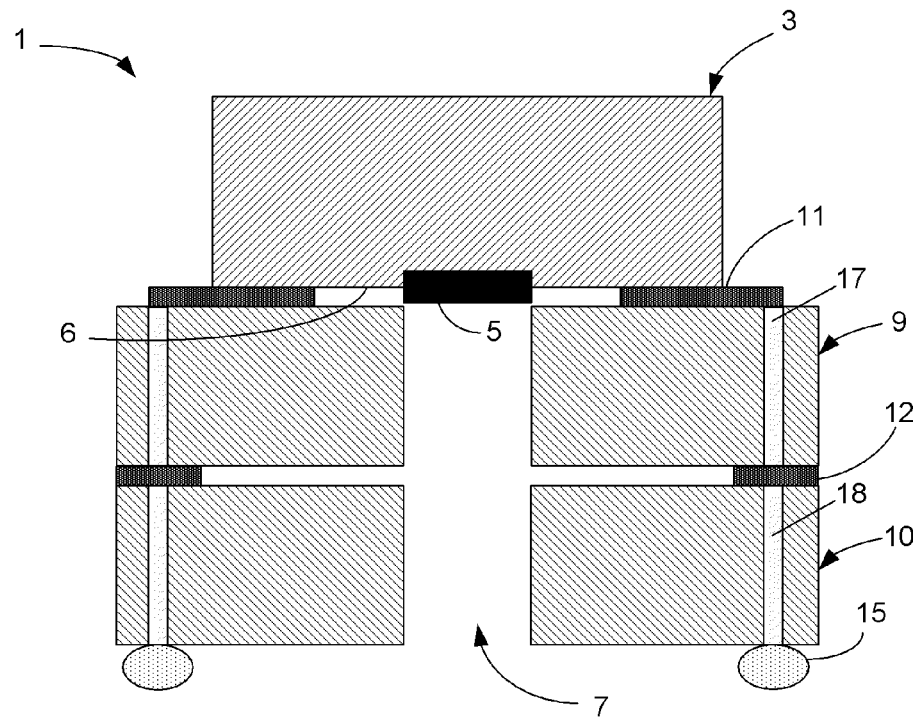
FIG. 3A is a schematic cross-section view of an optical sensor module having stacked ASIC dies with aligned holes.

FIG. 3A is a schematic cross-section view of an optical sensor module having stacked ASIC dies each facing upwards with aligned holes. The optical sensor module 1 is configured similar to the embodiment of FIG. 1C, with the addition of a second ASIC die 10 arranged vertically beneath the first ASIC die 9. This second ASIC die 10 can serve to provide additional function and increased signal processing capabilities. The optical sensor die 3 is facing downwards, such that the first surface 6, which includes the optical sensing area 5 and attendant circuitry, faces downward, as illustrated. The hole 7 passes through the both ASIC dies 9 and 10, and is substantially aligned with the optical sensing area 5. The optical sensor die 3 and first ASIC die 9 are joined mechanically and electrically by the adhesive 11, resulting in a stacked three-dimensional configuration. As noted above, the adhesive 11 can also serve to block light from reaching the optical sensing area 5 from the space between the first surface 6 of the optical sensor die 3 and the ASIC die 9, or a separate light dam can be provided. Similarly, the first ASIC die 9 and second ASIC die 10 are joined mechanically and electrically by another layer of adhesive 12. This second layer of adhesive 12 can also serve to block light from reaching the hole 7 from the space between the first and second ASIC dies 9 and 10, or a separate light dam can be provided. Accordingly, a "tunnel" or collimator is formed whereby light of a particular orientation is permitted to enter through the hole 7 and to strike the optical sensing area 5. The through vias 17 formed through the ASIC die 9 are electrically connected via the adhesive 12 to the through vias 18 formed through the second ASIC die 10. The through vias 17 and 18 provide for electrical interconnection between the circuitry near the top surface of the ASIC die 9 and contact pads (shown with solder bumps 15) arranged on the bottom surface of the second ASIC die 10, aligned with the vias 17.

Figure 3B:
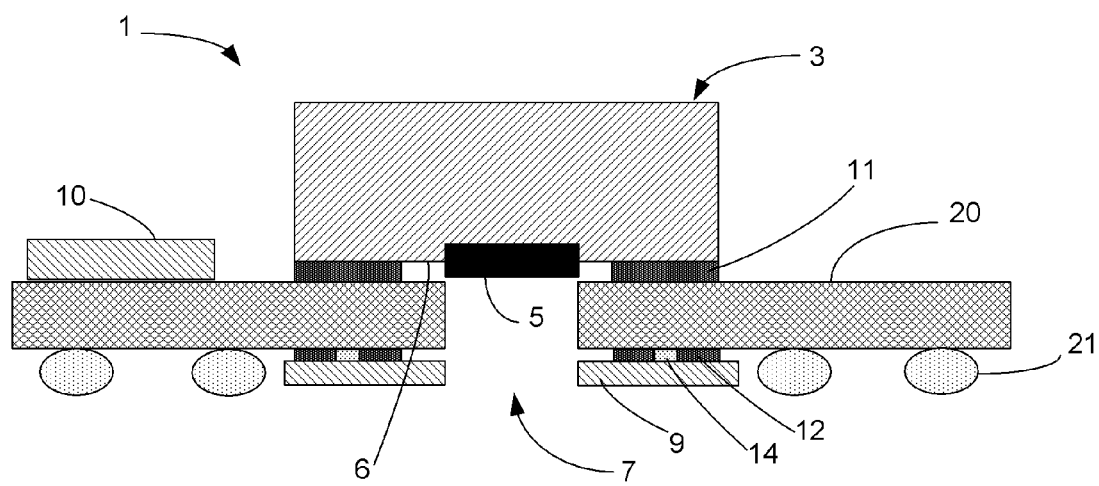
FIG. 3B is a schematic cross-section view of an optical sensor module integrated with a laminate substrate.

FIG. 3B is a schematic cross-section view of an optical sensor module integrated with a laminate substrate. The optical sensor die 3 again faces downwards, with the ASIC die 9 over the first surface 6. The optical sensor die 3 rests on top of a laminate substrate 20. A very low profile ASIC die 9, having a thickness less than the solder bumps 21, is disposed on the opposite side of the laminate substrate 20, with hole 7 extending through both the ASIC die 9 and the laminate substrate 20. The laminate substrate 20 is positioned between the ASIC die 9 and the optical sensor die 3. As with previously discussed embodiments, the hole 7 is substantially aligned with the optical sensing area 5. Adhesive 11 provides mechanical and electrical connection between the optical sensor die 3 and the laminate substrate 20, in addition to blocking light from passing through the area between the optical sensor die 3 and the laminate substrate 20. The ASIC 9 can be joined to the laminate substrate 20 by light blocking adhesive, such as NCP or ACF as noted above. Alternatively, electrical connection can be provided by a plurality of bumps 14, as shown. The bumps 14 can be surrounded by a layer of underfilled adhesive 12. Together the adhesive 12 and bumps 14 can provide mechanical and electrical connection between the ASIC die 9 and the laminate substrate 20, while also blocking light from passing through the area between the two. An additional ASIC die 10 can be disposed on the top surface of the laminate substrate 20, laterally adjacent to the optical sensor die 3. This second ASIC die 10 can provide additional functions and can be used in conjunction with the first ASIC die 9. Internal circuitry within the laminate substrate 20 (not shown) can provide for electrical connection between the adhesive 11 and the ASIC die 9 on the opposite surface. In various embodiments, other active (e.g., ASICs, individual transistors, etc.) and/or passive (e.g., resistors, capacitors, etc.) components may be attached to the surface of the laminate substrate 20. Additionally, other active and/or passive components may be embedded within the laminate substrate 20.

Figure 4:
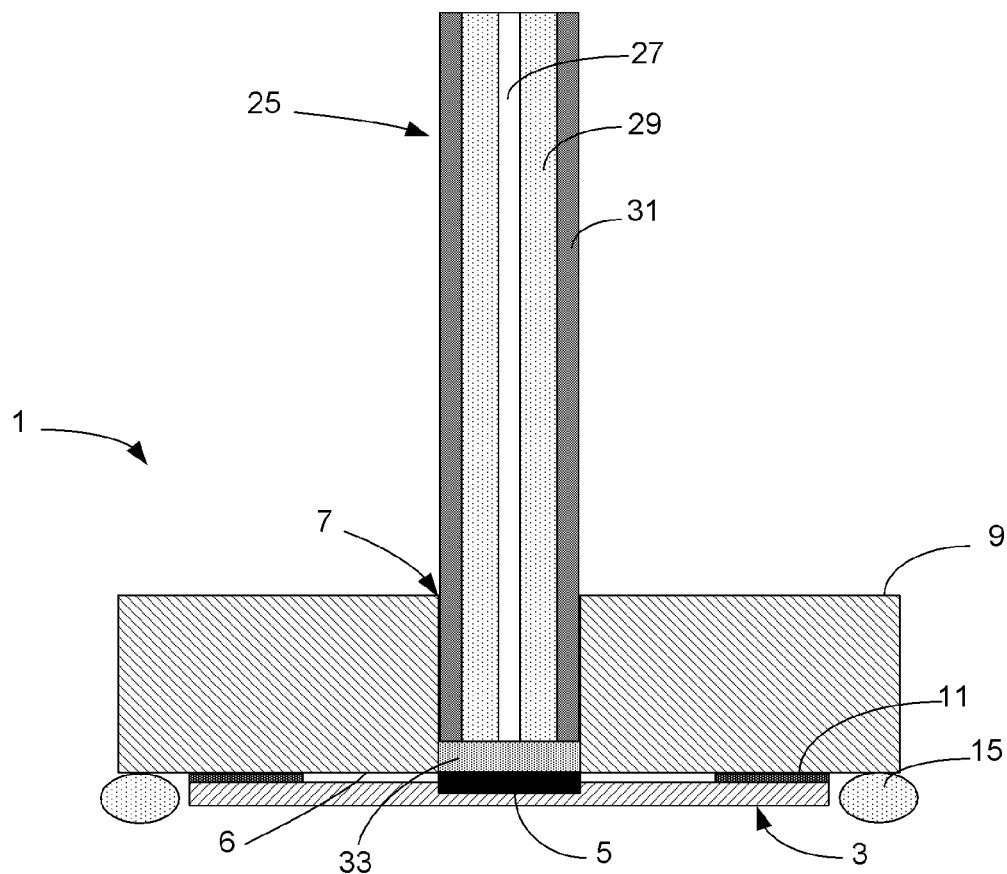
FIG. 4 is a schematic cross-section view of an optical sensor module having an optical fiber received therein.

FIG. 4 shows a schematic cross section of an optical sensor module having an integrated optical fiber. The structure of the optical sensor module 1 is similar to that described above with respect to FIG. 1B. As noted previously, the ASIC die 9 is arranged over the first surface 6 of the optical sensor die 3, with adhesive 11 providing mechanical and electrical connection between the two. Solder bumps 15 are arranged on bond pads of the ASIC die 9 for connection to an external substrate. An optical fiber 25 is arranged such that a portion is positioned within the hole 7 in the ASIC die 9. In the illustrated embodiment, the optical fiber 25 includes a core 27, which is surrounded by a cladding 29, which in turn is surrounded by a jacket 31. In some embodiments, the jacket 31 can be stripped from the portion of the optical fiber 25 that is inserted into the hole 7, such that only the cladding 29 and core 27 are received within the hole 7. In other embodiments, the hole 7 can be dimensioned to receive the optical fiber 25 with the jacket 31 in place. The optical fiber 25 can be a single mode fiber, having a diameter of approximately 100 microns. In other embodiments, the diameter of the fiber can vary, and the optical fiber 25 may be multimode fiber.

Optical glue 33 can be disposed in between the end of the optical fiber 25 and the optical sensing area 5. This optical glue can secure the optical fiber 25 in place within the hole 7, and also allows optical transmission between the optical fiber 25 and the optical sensing area 5. The illustrated assembly is configured as a receiver for an optical communication system. Light passes through the optical fiber 25 and is received by the optical sensing area 5. However, in other embodiments a similar arrangement can be used for an emitter in an optical communication system. In such a configuration, an emitter may be positioned in place of the optical sensing area 5. The emitter can then be oriented to direct light into the optical fiber 25. In other embodiments, an optical fiber 25 can be used in non-data applications. For example, the optical fiber 25 can be configured for use in a sensor assembly, in which the optical fiber 25 guides light from area region or object being sensed to the optical sensing area 5.

Figure 5:
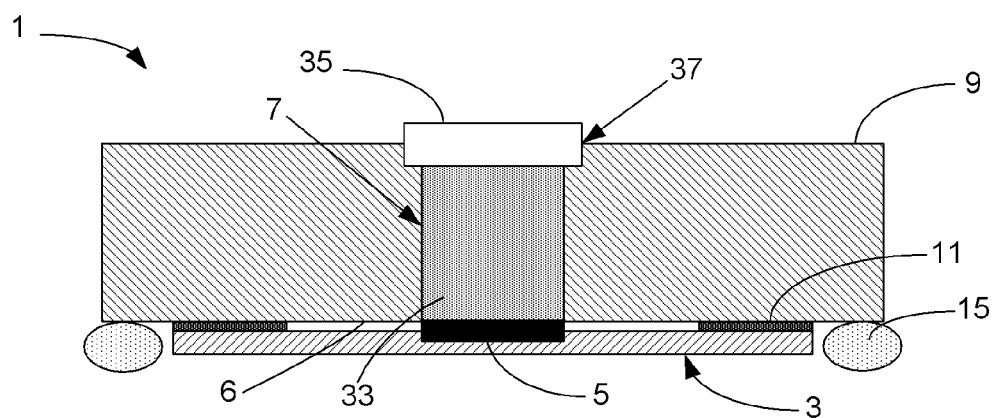
FIG. 5 is a schematic cross-section view of an optical sensor module with an integrated lens.

FIG. 5 shows a schematic cross section of an optical sensor module with an integrated lens. In the illustrated embodiment, the optical sensor module 1 includes a hole 7 through the ASIC die 9, as described elsewhere herein. However, there is a wider section 37 of the hole 7 at the top surface of the ASIC die 9. This wider section 37 can be dimensioned to receive an optical lens 35 therein. In some embodiments, the wider section 37 can be substantially concentric with the remainder of the hole 7. In some embodiments, the wider section 37 can be substantially circular as seen in plan view. In other embodiments, the wider section 37 can assume a variety of other shapes, for example rectangular, elliptical, or irregular, as seen in plan view. Optical glue 33 can be provided in the hole 7, and may substantially fill the region between the optical sensing area 5 and the optical lens 35. In alternative embodiments, the wider section 37 can be omitted, and an optical lens sized to fit directly within the hole 7 can be mounted therein with the use of optical glue. The optical lens 35 can take a variety of forms, depending on the application. For example, the optical lens 35 may be convex and configured to focus a portion of light incident thereon so that it is directed towards the optical sensing area 5. The optical lens 35 may be pre-molded, and may be made from glass, an encapsulant material, or other suitable transparent material. In some embodiments, an optical lens and an optical fiber can each be disposed in the hole. In some embodiments, additional optical elements, for example optical filters or antireflective layers, can be disposed in the hole. These other optical elements may be used separately or in conjunction with an optical lens.

Figure 6:
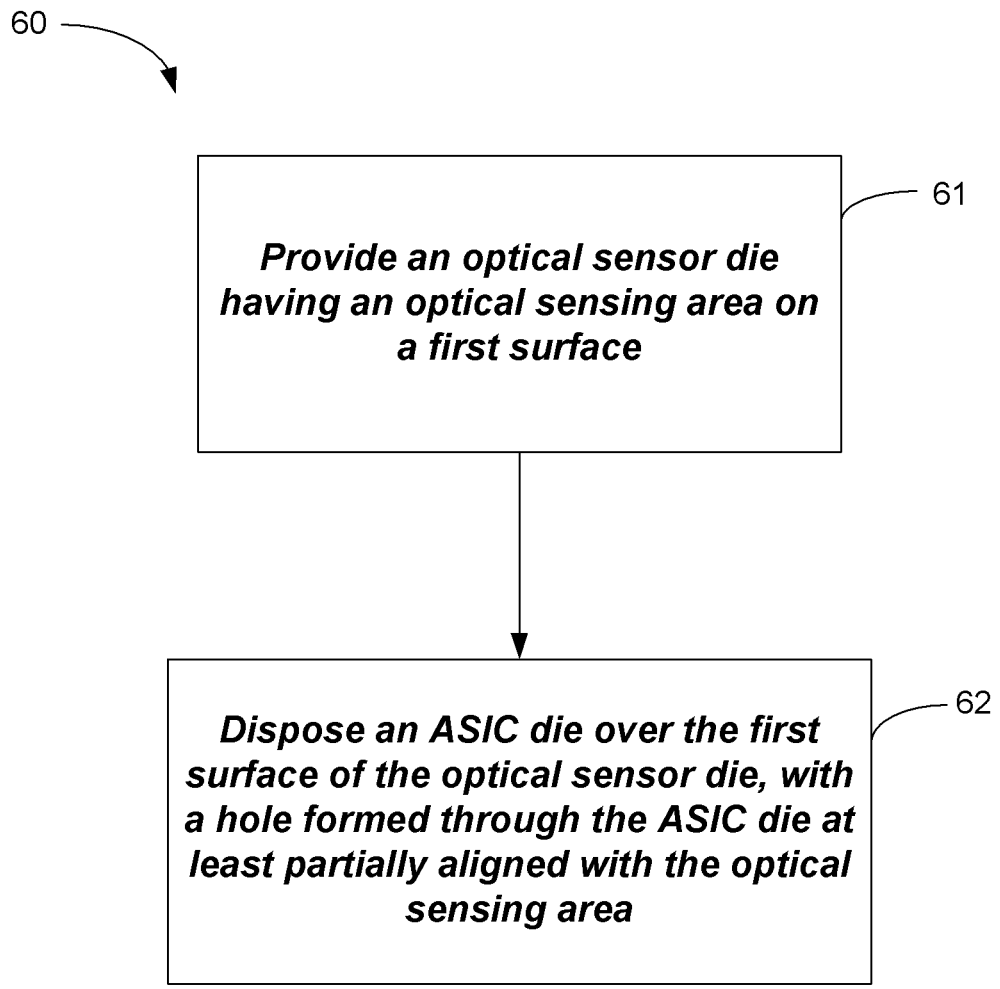
FIG. 6 is a flow chart illustrating a method for manufacturing an optical sensor module, according to an embodiment.

FIG. 6 is a flow chart illustrating a method for manufacturing an optical sensor module, according to an embodiment. Process 60 begins in block 61 with providing an optical sensor die having an optical sensing area on a first surface. The process 60 continues in block 62 with disposing an ASIC die over the first surface of the optical sensor die.

The ASIC die may be vertically arranged next to the first surface, but need not be in contact with the first surface. Additionally, intervening elements may be present between the ASIC die and the first surface of the optical sensor die. For example, as noted previously herein, an adhesive may be used to join the ASIC die and the optical sensor die. Additionally, in some embodiments a substrate having a hole therein may be arranged between the ASIC die and the first surface of the optical sensor die. The ASIC die has a hole formed therethrough, and the ASIC die is disposed such that the hole is at least partially aligned with the optical sensing area. In this configuration, light of certain orientations is permitted to pass through the hole in the ASIC die and to strike the optical sensing area on the first surface of the optical sensor die. As noted above, an optical fiber, lens structure, and/or other optical element may likewise be integrated with the hole in the ASIC die. The hole in the ASIC die can be formed at the wafer level, i.e., before singulation of the ASIC die, or alternatively the hole can be formed after singulation. In some embodiments, the widest cross-sectional width of the hole through the ASIC die can range from 10 microns to 1 millimeter. In some embodiments, the width of the hole can range from about 25 microns to about 250 microns.

The ASIC die and optical sensor die can be three-dimensionally stacked in a variety of relative orientations, as described above. For example, the optical sensor die can be arranged with its first surface face up, and the ASIC die arranged face down. The circuitry in each die in this configuration face one another, with the optical sensing area looking through the hole in the ASIC die. Electrical connections to an external device, for example bond pads with solder bumps attached thereto, can be arranged on the bottom surface of the optical sensor die opposite the first surface. In other embodiments, the optical sensor die can be significantly thinned, such that electrical connection to external devices can be provided through bond pads or other means on the ASIC die. In still other embodiments, the ASIC die may be arranged face up, with the first surface of the optical sensor die facing down, such that the optical sensing area looks through the hole in the ASIC die, and circuitry of the ASIC die faces the optical sensor die. Electrical connection to external devices, for example bond pads with solder bumps, can be provided on the bottom surface of the ASIC die. In each of these embodiments, the ASIC die is disposed over the first surface of the optical sensor die.

The adhesive can take a number of forms. For example, the adhesive can be ACF, NCP, or solder. The adhesive can be disposed surrounding the optical sensing area, for example in an annulus. In some embodiments, the adhesive can provide both a mechanical and an electrical connection between the ASIC die and the optical sensor die. In embodiments in which an electrical connection is provided by the adhesive, additional electrical connections can also be provided. In some embodiments, the same adhesive also provides light blocking around the hole at the interface between the sensor and ASIC dies. In other embodiments, a light dam can be provided around the hole at the interface between the sensor and ASIC dies, which can be independent of electrical connection and/or mechanical connection between the dies, or additionally provide at least some of the electrical connections between the dies.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An optical sensor device comprising:
   an optical sensor die having an optical sensing area on a first surface, the optical sensor die configured to generate an output signal associated with light detected by the optical sensor die, wherein the optical sensor device is configured to position a lowermost surface of the optical sensor die adjacent a substrate above an uppermost surface of the substrate;
   an application-specific integrated circuit (ASIC) die arranged over the first surface of the optical sensor die, the ASIC die comprising circuitry at or near a second surface of the ASIC die, the circuitry comprising an integrated circuit and configured to process the output signal from the optical sensor die, the integrated circuit configured to modify the output signal and to transmit the modified output signal to the substrate; and
   a hole formed through the ASIC die, wherein the hole is at least partially aligned with the optical sensing area, wherein the optical sensor die covers sensitive circuitry of the ASIC die to protect the sensitive circuitry.

2. The device of claim 1, wherein the hole is arranged such that at least a portion of light passing through the hole strikes the optical sensing area.

3. The device of claim 1, wherein the hole is substantially circular in cross-section.

4. The device of claim 1, wherein the widest cross-sectional width of the hole is between about 25 and about 250 microns.

5. The device of claim 1, wherein the hole is configured to receive an optical fiber therein.

6. The device of claim 1, further comprising a lens disposed in the hole.

7. The device of claim 6, wherein the lens comprises premolded glass or clear encapsulant.

8. The device of claim 1, further comprising an optical filter disposed in the hole.

9. The device of claim 1, further comprising an optical glue disposed in the hole.

10. The device of claim 1, further comprising a substantially opaque adhesive surrounding the optical sensing area, the adhesive disposed between the ASIC die and the optical sensor die.

11. The device of claim 10, wherein the adhesive comprises anisotropic conductive film (ACF) that is substantially opaque at least in areas surrounding the optical sensing area.

12. The device of claim 10, wherein the adhesive comprises nonconductive paste (NCP) that is substantially opaque at least in areas surrounding the optical sensing area.

13. The device of claim 10, wherein the adhesive comprises solder.

14. The device of claim 1, further comprising:
   one or more bond pads arranged on a second surface of the optical sensor die opposite the first surface; and
   one or more vias through the optical sensor die configured to provide electrical interconnection between the ASIC die and the one or more bond pads.

15. The device of claim 1, further comprising:
   one or more bond pads arranged on a side of the ASIC die opposite the optical sensing area; and
   one or more vias through the ASIC die configured to provide electrical interconnection between the optical sensor die and the one or more bond pads.

16. The device of claim 1, further comprising a polyimide layer formed over the optical sensing area.

17. The device of claim 1, further comprising the substrate, wherein the substrate is arranged such that the optical sensor die is disposed between the substrate and the ASIC die.

18. The device of claim 17, wherein the substrate is substantially rigid.

19. The device of claim 17, wherein the substrate is flexible.

20. The device of claim 1, wherein the ASIC die includes embedded passive electronic components.

21. The device of claim 1, wherein the optical sensor die is integrated with a laminate substrate, and wherein the laminate substrate includes a plurality of passive electronic components attached thereto.

22. The device of claim 1, further comprising a second ASIC die arranged over a side of the ASIC die opposite the optical sensor die, and wherein the hole formed through the ASIC die extends through the second ASIC die.

23. A method of manufacturing an optical sensor device, the method comprising:
providing an optical sensor die having an optical sensing area on a first surface, the optical sensor die configured to generate an output signal associated with light detected by the optical sensor die, wherein the optical sensor device is configured to position a lowermost surface of the optical sensor die adjacent a substrate above an uppermost surface of the substrate; and
disposing an application-specific integrated circuit (ASIC) die over the first surface of the optical sensor die, the ASIC die having a hole formed therethrough, wherein the hole is at least partially aligned with the optical sensing area, the ASIC die comprising circuitry at or near a second surface of the ASIC die, the circuitry comprising an integrated circuit and configured to process the output signal from the optical sensor die, the integrated circuit configured to modify the output signal and to transmit the modified output signal to the substrate,
wherein the optical sensor die covers sensitive circuitry of the ASIC die to protect the sensitive circuitry.

24. The method of claim 23, wherein disposing the ASIC die comprises arranging the ASIC die such that at least a portion of light passing through the hole strikes the optical sensing area.

25. The method of claim 23, wherein the hole is substantially circular in cross-section.

26. The method of claim 23, wherein the widest cross-sectional width of the hole is between about 25 and 250 microns.

27. The method of claim 23, further comprising disposing a lens in the hole.

28. The method of claim 23, further comprising disposing an optical filter in the hole.

29. The method of claim 23, further comprising disposing an optical glue in the hole.

30. The method of claim 23, further comprising inserting an optical fiber into the hole.

31. The method of claim 23, wherein disposing the ASIC die comprises providing a substantially opaque adhesive between the ASIC die and the optical sensor die.

32. The method of claim 31, wherein the substantially opaque adhesive surrounds the optical sensing area.

33. The method of claim 32, wherein the adhesive comprises at least one of: an anisotropic conductive film (ACF), a nonconductive paste (NCP), and solder.

34. The method of claim 23, further comprising disposing a polyimide layer over the optical sensing area.

35. The method of claim 23, further comprising mounting the optical sensor die onto the substrate such that the optical sensor die is disposed between the substrate and the ASIC die.

36. The method of claim 35, wherein mounting the optical sensor die onto the substrate comprises providing electrical interconnection between the optical sensor die and the substrate.

37. The method of claim 35, wherein mounting the optical sensor die and the ASIC die comprises providing electrical interconnection between the substrate and the ASIC die.

38. The method of claim 25, further comprising disposing a second ASIC die over a side of the ASIC die opposite the optical sensor die, wherein the hole formed through the ASIC die extends through the second ASIC die.

39. An optical sensor device comprising:
an optical sensor die having an optical sensing area, the optical sensor die configured to generate an output signal associated with light detected by the optical sensor die, wherein the optical sensor device is configured to position a lowermost surface of the optical sensor die adjacent a substrate above an uppermost surface of the substrate; and
an application-specific integrated circuit (ASIC) die having a hole formed therethrough, the ASIC die comprising an integrated circuit and configured to process the output signal from the optical sensor die, the integrated circuit configured to modify the output signal and to transmit the modified output signal to the substrate; and
a substantially opaque adhesive arranged in an annular configuration to surround the optical sensing area, the adhesive disposed in a gap between the ASIC die and the optical sensor die to block light from reaching the optical sensing area through the gap,
wherein the hole is at least partially aligned with the optical sensing area.

40. The optical sensor device of claim 1, further comprising a bond pad on the optical sensor die to provide electrical communication with the substrate.

41. The optical sensor device of claim 1, further comprising the substrate and a bond pad on the ASIC die, wherein the optical sensor die is disposed between the ASIC die and the uppermost surface of the substrate.

42. The optical sensor device of claim 39, further comprising a bond pad on the optical sensor die to provide electrical communication with the substrate.

43. The optical sensor device of claim 39, further comprising the substrate and a bond pad on the ASIC die, wherein the optical sensor die is disposed between the ASIC die and the uppermost surface of the substrate.

44. The device of claim 1, wherein the ASIC die comprises at least one of an amplifier, an analog-to-digital converter, and a microcontroller.

45. The optical sensor device of claim 39, wherein the ASIC die comprises at least one of an amplifier, an analog-to-digital converter, and a microcontroller.

46. The optical sensor device of claim 39, wherein the adhesive mechanically and electrically connects the ASIC die with the optical sensor die.

47. The optical sensor device of claim 39, wherein the annular configuration of the adhesive comprises a solid, light-blocking annular ring around the optical sensing area.

* * * * *